United States Patent
Ning et al.

(10) Patent No.: US 12,216,186 B2
(45) Date of Patent: Feb. 4, 2025

(54) SYSTEM AND METHODS FOR ULTRA-FAST MULTI-DIMENSIONAL DIFFUSION-RELAXATION MRI USING TIME-DIVISION MULTIPLEXING SEQUENCES

(71) Applicants: The Brigham and Women's Hospital, Inc., Boston, MA (US); Children's Medical Center Corporation, Boston, MA (US)

(72) Inventors: Lipeng Ning, Belmont, MA (US); Yogesh Rathi, Lexington, MA (US); Yang Ji, Brighton, MA (US); Borjan Gagoski, Cambridge, MA (US)

(73) Assignees: The Brigham and Women's Hospital, Inc., Boston, MA (US); Children's Medical Center Corporation, Boston, MA (US)

( * ) Notice: Subject to any disclaimer, the term of this patent is extended or adjusted under 35 U.S.C. 154(b) by 34 days.

(21) Appl. No.: 18/008,077

(22) PCT Filed: Jun. 3, 2021

(86) PCT No.: PCT/US2021/035693
§ 371 (c)(1),
(2) Date: Dec. 2, 2022

(87) PCT Pub. No.: WO2021/247857
PCT Pub. Date: Dec. 9, 2021

(65) Prior Publication Data
US 2023/0236274 A1  Jul. 27, 2023

Related U.S. Application Data

(60) Provisional application No. 63/034,014, filed on Jun. 3, 2020.

(51) Int. Cl.
*G01V 3/00* (2006.01)
*G01R 33/48* (2006.01)
(Continued)

(52) U.S. Cl.
CPC ..... *G01R 33/5617* (2013.01); *G01R 33/4818* (2013.01); *G01R 33/50* (2013.01); *G01R 33/56341* (2013.01)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS 5,126,671 A * 6/1992 Bodenhausen .... G01R 33/4616
                                                    324/309
5,657,758 A * 8/1997 Posse ................ G01R 33/4833
                                                    324/309

(Continued)

FOREIGN PATENT DOCUMENTS

CN   1576875 B  * 6/2010 ....... G01R 33/56563
CN   104363829 A * 2/2015 ......... G01R 33/5616

*Primary Examiner* — Walter L Lindsay, Jr.
*Assistant Examiner* — Frederick Wenderoth
(74) *Attorney, Agent, or Firm* — Quarles & Brady LLP (57) ABSTRACT

Scan time in diffusion-relaxation magnetic resonance imaging ("MRI") is reduced by implementing time-division multiplexing ("TDM"). In general, time-shifted radio frequency ("RF") pulses are used to excite two or more imaging volumes. These RF pulses are applied to induce separate echoes for each slice. Diffusion MRI data can thus be acquired with different echo times, or alternatively with the same echo time, in significantly reduced overall scan time. Multidimensional correlations between diffusion and relaxation parameters can be estimated from the resulting data.

20 Claims, 7 Drawing Sheets

(51) Int. Cl.
    *G01R 33/50*      (2006.01)
    *G01R 33/561*     (2006.01)
    *G01R 33/563*     (2006.01)

(58) Field of Classification Search
    USPC .......................................................... 324/309
    See application file for complete search history.

(56) References Cited

U.S. PATENT DOCUMENTS

| | | | |
|---|---|---|---|
| 5,883,514 A * | 3/1999 | Ishikawa | G01R 33/5615 |
| | | | 324/307 |
| 10,317,488 B2 * | 6/2019 | Blumhagen | G01R 33/5607 |
| 10,317,497 B2 * | 6/2019 | Neji | G01R 33/543 |
| 2014/0132261 A1 * | 5/2014 | Kim | G01R 33/4835 |
| | | | 324/309 |
| 2014/0266195 A1 * | 9/2014 | Levin | G01R 33/56509 |
| | | | 324/309 |
| 2016/0089103 A1 * | 3/2016 | Darrow | A61B 6/469 |
| | | | 600/407 |
| 2017/0315202 A1 * | 11/2017 | Bhat | G01R 33/4835 |
| 2018/0074147 A1 * | 3/2018 | Carinci | G01R 33/5617 |
| 2018/0106877 A1 * | 4/2018 | Zeller | G01R 33/5602 |
| 2019/0369195 A1 * | 12/2019 | Zeller | G01R 33/583 |

* cited by examiner

SYSTEM AND METHODS FOR ULTRA-FAST MULTI-DIMENSIONAL DIFFUSION-RELAXATION MRI USING TIME-DIVISION MULTIPLEXING SEQUENCES

CROSS-REFERENCE TO RELATED APPLICATIONS

This application claims the benefit of U.S. Provisional Patent Application Ser. No. 63/034,014, filed on Jun. 3, 2020, and entitled "System and Methods for Ultra-Fast Multi-Dimensional Diffusion-Relaxation MRI Using Time-Division Multiplexing Sequences."

STATEMENT REGARDING FEDERALLY SPONSORED RESEARCH

This invention was made with government support under MH116352, MH117346, and MH116173 awarded by the National Institutes of Health. The government has certain rights in the invention.

BACKGROUND

Magnetic resonance imaging ("MRI") techniques, such as diffusion MRI and T2 relaxometry, probe different physical or biological properties of tissues, such as brain tissues in neuroimaging applications. For example, T2 relaxation time is related to the biochemical composition of the tissue (e.g., myelin), while diffusion MRI is sensitive to the tissue structure, such as tissue microstructure.

The standard analysis approach in diffusion MRI is based on acquiring data at a fixed echo time ("TE") and assumes that the underlying diffusion is independent of T2 relaxation time. Joint analysis of diffusion MRI data acquired at different TEs allows for the coupling between T2 relaxation and diffusion to be characterized and provides unique information about the tissue properties that are not available using the standard methods.

Consequently, multidimensional correlation of transverse relaxation rates and diffusion coefficient of water molecules has been recently investigated to understand tissue microstructure, as described in Benjamini D and Basser P J, "Use of marginal distributions constrained optimization (MADCO) for accelerated 2D MRI relaxometry and diffusometry," Journal of Magnetic Resonance, vol. 271, pp. 40-45, 2016; Kim D, Doyle E K, Wisnowski J L, Kim J H, and Haldar J P, "Diffusion-relaxation correlation spectroscopic imaging: A multidimensional approach for probing microstructure," Magnetic Resonance in Medicine, vol. 78, no. 6, pp. 2236-2249, 2017; Hutter J, Slator P J, Christiaens D, Teixeira R P A, Roberts T, Jackson L, Price A N, Malik S, and Hajnal J V, "Integrated and efficient diffusion-relaxometry using ZEBRA," Scientific Reports, vol. 8, no. 1, p. 15138, 2018; de Almeida Martins J P and Topgaard D, "Multidimensional correlation of nuclear relaxation rates and diffusion tensors for model-free investigations of heterogeneous anisotropic porous materials," Scientific Reports, vol. 8, no. 2, p. 2488, 2018; Veraart J, Novikov D S, and Fieremans E, "TE dependent diffusion imaging (TEdDI) distinguishes between compartmental T2 relaxation times," NeuroImage, vol. 182, pp. 360-369, 2018; and Lampinen B, Szczepankiewicz F, Noven M, van Westen D, Hansson O, Englund E, Martensson J, Westin C-F, and Nilsson M, "Search-°ing for the neurite density with diffusion MRI: challenges for biophysical modeling," arXiv e-prints, p. arXiv:1806.02731, June 2018.

To implement multidimensional correlation of transverse relaxation rates and diffusion parameters, a large number of imaging measurements acquired with different combinations of b-values and TE are required. For example, analysis techniques based on diffusion-relaxation correlation spectroscopy estimate the joint probability density function ("PDF") of relaxation and diffusion. In this approach, the joint PDF of relaxation and diffusion is estimated by numerically solving an inverse Laplace transform using a large number of imaging measurements.

Using conventional diffusion imaging techniques requires scan times that are impractical for routine clinical use. For example, acquiring sufficient imaging measurements for multidimensional correlation analysis between diffusion and relaxation parameters can take upwards of 90 minutes or more. There is a need, then, to provide data acquisition techniques that reduce the scan time necessary to acquire the data for these diffusion-relaxation multidimensional correlation analyses.

SUMMARY OF THE DISCLOSURE

The present disclosure addresses the aforementioned drawbacks by providing a method for magnetic resonance imaging ("MRI"). The method includes controlling an MRI system to perform a pulse sequence that includes: at least a first radio frequency (RF) excitation pulse that excites spins in a first imaging volume and a second RF excitation pulse that excites spins in a second imaging volume, where the second RF excitation pulse is time-shifted relative to the first RF excitation pulse by a time duration; at least a first RF refocusing pulse that refocuses spins in the first imaging volume at a first echo time relative to the first RF excitation pulse and a second RF refocusing pulse that refocuses spins in the second imaging volume at a second echo time relative to the second RF excitation pulse, where the second RF refocusing pulse is time-shifted relative to the first RF refocusing pulse by the time duration; a first readout during which first magnetic resonance data are acquired from the first imaging volume; and a second readout during which second magnetic resonance data are acquired from the second imaging volume. Magnetic resonance images are then reconstructed from the first magnetic resonance data and the second magnetic resonance data, wherein the magnetic resonance images depict the first imaging volume and the second imaging volume.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for reducing scan time in magnetic resonance imaging ("MRI") by implementing time-division multiplexing ("TDM"). In general, the systems and methods described in the present disclosure utilize time-shifted radio frequency ("RF") pulses to excite two or more slices. These RF pulses are applied to induce separate echoes for each slice. The systems and methods described in the present disclosure can be applied to acquire MRI data with different echo times, or alternatively with the same echo time, in significantly reduced overall scan time. Advantageously, the systems and methods enable diffusion-relaxation MRI in clinically acceptable scan times.

The techniques described in the present disclosure are different from simultaneous multislice ("SMS") imaging, which uses a single multiband RF pulse to excite two or more slices, or other such imaging techniques. Advantageously, though, the TDM-based methods described in the present disclosure can be combined with existing SMS techniques to provide further reduction of scan time.

Likewise, the techniques described in the present disclosure are different from simultaneous image refocusing ("SIR"), in which the echoes from different slice locations are acquired using different readouts in order to avoid temporally overlapping the magnetic resonance signals. This is accomplished by applying gradient pulses in the readout direction after each RF excitation pulse, such that when data acquisition proceeds in the presence of a readout gradient, the magnetic resonance signals originating from the different slice locations come into phase and form an echo at different times, whether with the same echo time or a different echo time. Because the echo signals for the different slices are formed at different times, they can be selectively extracted and subsequently processed.

Advantageously, the systems and methods described in the present disclosure provide an improvement over conventional SIR-based techniques. For instance, the systems and methods described in the present disclosure can utilize the time-shift between RF excitation pulses to induce different echo times from different slices, whereas conventional SIR sequences use a fixed set of RF pulses where the time-shift is fixed and approximately zero. As another example improvement, the systems and methods described in the present disclosure can apply multiple time-shifted RF refocusing pulses to induce separate echoes from different slices, whereas conventional SIR sequences do not change the order or timing of the RF refocusing pulses in order to change the echo time. As still another example improvement, the systems and methods described in the present disclosure can induce separate echoes for different slices which are acquired using separate readout sequences. In conventional SIR sequences, the same echo from different slices is acquired using a single readout sequence.

In general, the systems and methods described in the present disclosure utilize multiple time-shifted RF excitation pulses to excite spins in different imaging volumes, such as different slices, different slabs, different sets of slices, or other such types of imaging volumes. The spins are then refocused using a similar number of time-shifted RF refocusing pulses. Echo signals are then generated for each imaging volume using a different readout for each imaging volume. Data are acquired for each imaging volume by detecting and sampling the echo signals in each readout.

Advantageously, using time-shifted, or time-divided, RF pulses to excite multiple sequences to induce non-overlapping echoes (e.g., spin echoes) for different imaging volumes enables the acquisition of different imaging volumes with either different or the same echo time ("TE") values. In this way, scan time can be reduced by removing the need for multiple separate repetitions of the same pulse sequence in order to acquire data with different echo times, in different imaging volumes, or both. As a result, the systems and methods described in the present disclosure make it possible to acquire diffusion MRI data with different echo times within a clinically feasible time frame. The systems and methods described in the present disclosure also allow for estimation of relaxation parameter maps (e.g., T2 maps) without any additional data acquisitions. Further still, as mentioned above, the imaging techniques described in the present disclosure are compatible with SMS and multi-echo imaging techniques. By integrating the systems and methods with these techniques, scan time can be even further reduced.

Figure 1:
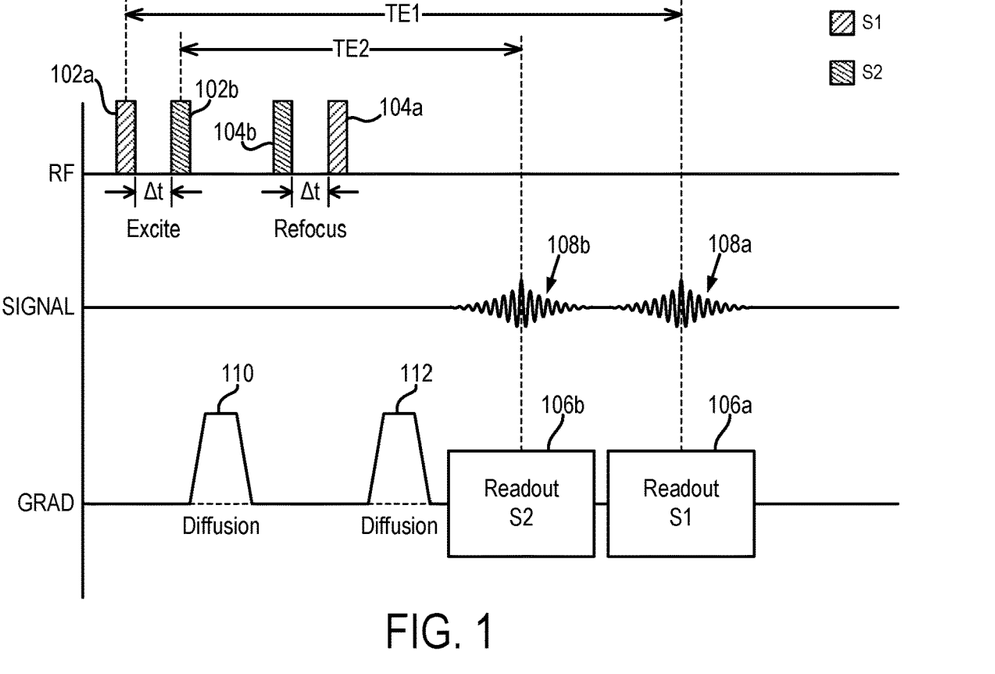
FIG. 1 is an example pulse sequence diagram for a time-division multiplexing diffusion magnetic resonance imaging (MRI) pulse sequence, in which two RF excitation and refocusing pulses are used to generate echoes with different echo times in two respective imaging volumes.

Referring now to FIG. 1, an example pulse sequence diagram for a time-shifted diffusion MRI sequence is shown. The example pulse sequence shown in FIG. 1 includes two time-shifted RF excitation pulses 102a and 102b. The first RF excitation pulse 102a excites spins in a first imaging volume, S1, and the second RF excitation pulse 102b excites spins in a second imaging volume, S2. To this end, the RF excitation pulses 102a, 102b can be played out in the presence of the appropriate magnetic field gradients for slice encoding, slab encoding, or other spatial encoding and/or selection of the imaging volumes. The RF excitation pulses 102a, 102b are applied at different time points that are separated by a duration of time, $\Delta t$. That is, the RF excitation pulses 102a, 102b are time-shifted RF excitation pulses that are shifted in time relative to each other.

The pulse sequence also includes a first RF refocusing pulse 104a that refocuses spin magnetization in the first imaging volume, S1, and a second RF refocusing pulse 104b that refocuses spin magnetization in the second imaging volume, S2. Like the RF excitation pulses 102a, 102b, the RF refocusing pulses 104a, 104b are time-shifted relative to each other, such that that two RF refocusing pulses 104a, 104b are separated by the same time duration of time, Δt, as the RF excitation pulses 102a, 102b.

In this example pulse sequence, the order in which the RF refocusing pulses 104a, 104b are applied is reversed relative to the order in which the RF excitation pulses 102a, 102b are applied. As a result, the spin magnetization in the first imaging volume, S1, will be refocused at a first echo time, TE1, and the spin magnetization in the second imaging volume, S2, will be refocused at a second echo time, TE2, where TE1 and TE2 have different values as measured from the respective RF excitation pulses 102a and 102b.

A first readout 106a facilitates the formation of a first echo signal 108a in the first imaging volume, S1, and a second readout 106b facilitates the formation of a second echo signal 108b in the second imaging volume S2. Like the RF refocusing pulses 104a, 104b, the order in which the first and second readouts 106a, 106b are applied for the respective imaging volumes is reversed relative to the order in which the RF excitation pulses 102a, 102b are applied.

Any suitable readout scheme can be used for the first and second readouts 108a, 108b. For example, a spin-echo readout can be used. As another example, an echo planar imaging ("EPI") readout can be used. In these instances, the first echo 108a and the second echo 108b will each be an echo train that includes a plurality of echo signals. The readouts 108a, 108b can implement Cartesian sampling or non-Cartesian sampling schemes, such as radial or spiral sampling.

The RF refocusing pulses 104a, 104b are bridged by diffusion encoding gradients 110 and 112. These diffusion encoding gradients 110 and 112 are equal in size; that is, their areas are equal. The diffusion encoding gradients 110 and 112, are produced through the application of diffusion encoding gradient lobes along one or more of the gradient axes (e.g., $G_x$, $G_y$, and $G_z$). By changing the amplitudes and other characteristics of the diffusion encoding gradient lobes, the acquired echo signals 108a, 108b can be weighted for diffusion occurring along any arbitrary direction. For example, when the diffusion encoding gradients 110 and 112 are composed solely of gradient lobes applied along the $G_z$ gradient axis, the acquired echo signals 108a, 108b will be weighted for diffusion occurring along the z-direction. As another example, if the diffusion encoding gradients 110 and 112 are composed of gradient lobes applied along both the $G_x$ and $G_y$ gradient axes, then the echo signals 108a, 108b will be weighted for diffusion occurring in the x-y plane along a direction defined by the relative amplitudes of the gradient lobes.

Diffusion encoding, or weighting, of the acquired echo signals 108a, 108b is provided when spins undergo random Brownian motion, or diffusion, during the time interval, Δ, spanned between the application of the first and second diffusion gradients 110 and 112, respectively. The first diffusion encoding gradient 110 dephases the spins in the imaging volumes, whereas the second diffusion encoding gradient 112 acts to rephase the spins by an equal amount. When spins undergo random diffusive motion during this time interval, however, their phases are not properly rephased by the second diffusion gradient 112. This phase difference results in a signal attenuation related to the diffusion occurring along the direction prescribed by the diffusion encoding gradients 110 and 112. The more diffusion that occurs, the more signal attenuation that results. Although the diffusion encoding gradients 110 and 112 are shown as having the same polarity, in some instances the polarities can be changed for the one or more imaging volumes.

As described above, following excitation of the spins in the prescribed imaging volumes, data are acquired by sampling diffusion-weighted echo signals 108a, 108b in the presence of respective readouts 106a, 106b. For instance, in the case of an EPI readout scheme, the readouts 106a, 106b may include alternating readout gradients that are preceded by the application of a pre-winding gradient that acts to move the first sampling point along the frequency-encoding, or readout, direction by a prescribed distance in k-space. Spatial encoding of the respective echo signal trains along a phase-encoding direction is performed by a series of phase encoding gradient blips, which are each played out in between the successive signal readouts such that each echo signal in the respective echo signal trains is separately phase-encoded. The phase-encoding gradient blips are preceded by the application of a pre-winding gradient that acts to move the first sampling point along the phase-encoding direction by a prescribed distance in k-space.

As is known in the art, the foregoing pulse sequence can be repeated a plurality of times while applying different spatial encoding gradients to select different imaging volumes during each repetition such that a plurality of imaging volumes is sampled. In some other implementations, a simultaneous multislice excitation and acquisition scheme can also be implemented. As one example, the blipped-CAIPIRINHA acquisition described in U.S. Pat. No. 8,405,395, which is herein incorporated by reference in its entirety, can be implemented.

It will also be appreciated that additional RF pulses other than those described above may also be integrated into the pulse sequence. As one non-limiting example, one or more magnetization preparation RF pulses may be applied before the RF excitation pulses 102. For instance, an inversion recovery ("IR") RF pulse may be applied before the RF excitation pulses 102.

Figure 2:
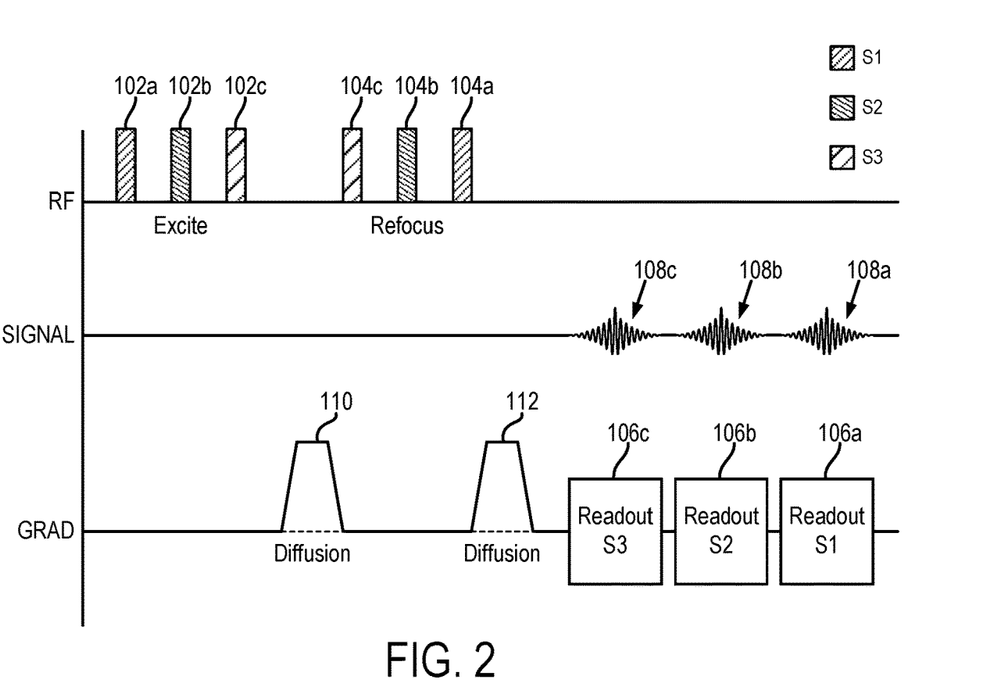
FIG. 2 is an example pulse sequence diagram for a time-division multiplexing diffusion MRI pulse sequence, in which three RF excitation and refocusing pulses are used to generate echoes with different echo times in three respective imaging volumes.

FIG. 2 shows an example pulse sequence diagram for a time-shifted diffusion MRI sequence in which three imaging volumes are excited in each repetition. In this example, three RF excitation pulses 102a, 102b, 102c are applied to each of three different imaging volumes S1, S2, and S3. As before, the imaging volumes may be slices, slabs, sets of slices, or other suitable imaging volumes. As in the pulse sequence shown in FIG. 1, the RF excitation pulses 102a, 102b, 102c are all time-shifted RF pulses that are shifted relative to each other by a duration of time. In some embodiments, each RF excitation pulse 102a, 102b, 102c is separated in time by the same duration, Δt. In some other embodiments, the first two RF excitation pulses (102a, 102b) may be separated by a different duration of time than the last two RF excitation pulses (102b, 102c).

In this example, the pulse sequence also include three RF refocusing pulses 104a, 104b, 104c, each applied to respective one of the three imaging volumes S1, S2, and S3. Like pulse sequence shown in FIG. 1, the order in which the RF refocusing pulses 104a, 104b, 104c are applied is reversed relative to the order in which the RF excitation pulses 102a, 102b, 102c are applied. That is, where the imaging volumes are excited in the order of S1 then S2 then S3, the RF refocusing pulses 104 are applied to S3 then to S2 then to S1. Similarly, the pulse sequence includes three readouts 106a, 106b, 106c, which facilitate the formation of three echo signals 108a, 108b, 108c in each of the respective imaging volumes S1, S2, and S3. Like the RF refocusing pulses 104a, 104b, 104c, the readouts 106a, 106b, 106c are applied in the reverse order relative to the RF excitation pulses 102a, 102b, 102c. The RF refocusing pulses 104a, 104b, 104c are bridged by two diffusion encoding gradients 110 and 112, such that the acquired data are diffusion-weighted data, as in the pulse sequence shown in FIG. 1.

It will be appreciated by those skilled in the art that the pulse sequences shown in FIGS. 1 and 2 can be further adapted to include more than two or three imaging volumes by incorporating the appropriate number of time-shifted RF excitation pulses, RF refocusing pulses, and readouts. Furthermore, it will be appreciated that when more than two imaging volumes are excited in each repetition of the pulse sequence, the order in which the RF excitation pulses 102 are applied and the order in which the RF refocusing pulses 104 and readouts 106 are applied can be varied, provided that a different order is used for the RF excitation pulses 102 than the RF refocusing pulses 104 and readouts 106 to maintain that the data for each imaging volume are acquired with a different echo time. As described below, the pulses sequences can be differently adapted to acquire data in each imaging volume with the same echo time.

Figure 3:
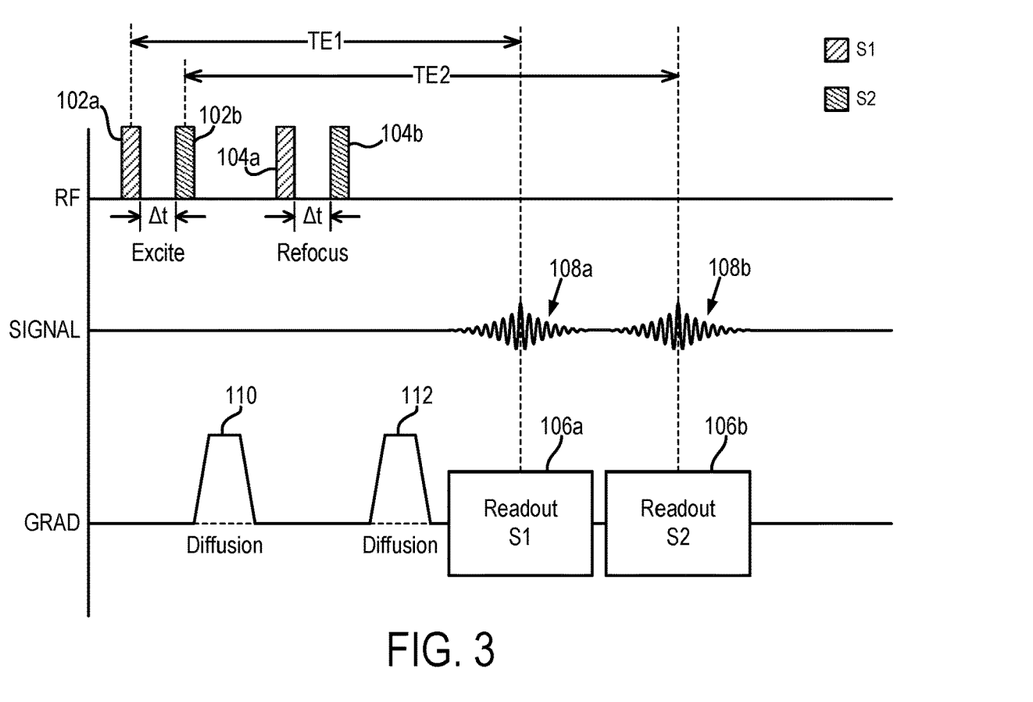
FIG. 3 is an example pulse sequence diagram for a time-division multiplexing diffusion MRI pulse sequence, in which two RF excitation and refocusing pulses are used to generate echoes with the equal echo times in two respective imaging volumes.

As an example, the pulse sequence shown in FIG. 3 could be adapted such that the imaging volumes are excited in the order S1-S2-S3, but refocused/sampled in the order S3-S1-S2, S2-S1-S3, S2-S3-S1, or S1-S3-S2. It will be appreciated that other combinations of the imaging volume ordering for both the RF excitation pulses 102 and RF refocusing pulses 104 can be implemented in these examples, provided that the same ordering is not used for both the RF excitation pulses 102 and RF refocusing pulses 104. Further, it will be appreciated that these examples can be generally applied to those instances when more than three imaging volumes are being excited.

FIG. 3 shows an example pulse sequence diagram for a time-shifted diffusion MRI sequence in which each imaging volume is acquired with the same echo time. In this example, the RF refocusing pulses 104a, 104b are applied to the respective imaging volumes (S1, S2) in the same order in which the RF excitation pulses 102a, 102b are applied to the imaging volumes. Similarly, the first and second readouts 106a, 106b are applied in this same order. As a result, the first echo signal 106a will be formed at a first echo time TE1 that is equal to the second echo time, TE2, at which the second echo signal 106b is formed, measured relative to the respective RF excitation pulses 102a, 102b.

Figure 4:
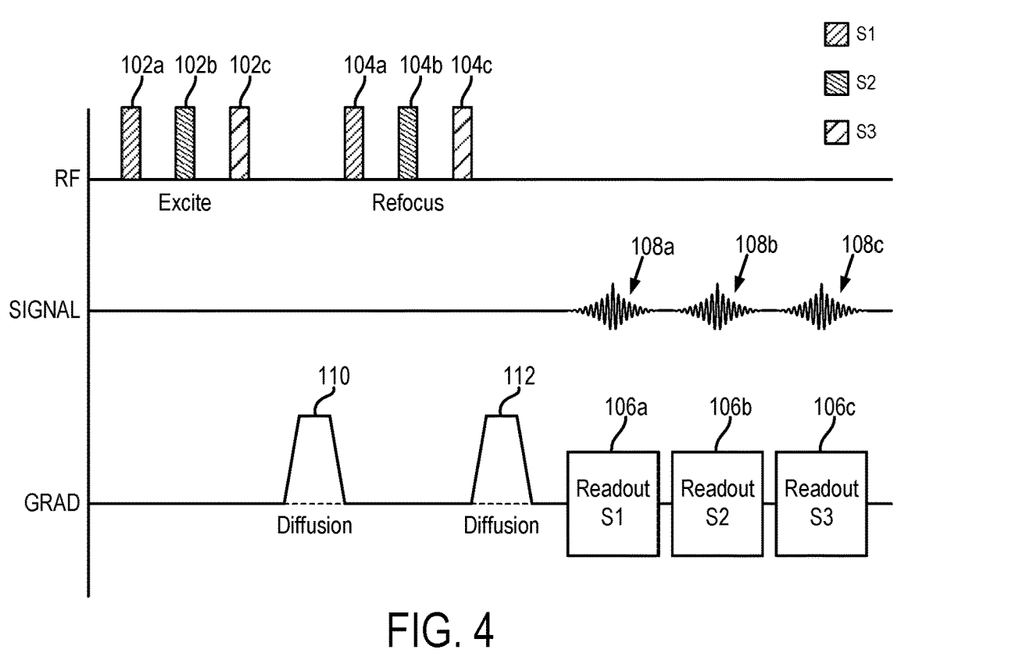
FIG. 4 is an example pulse sequence diagram for a time-division multiplexing diffusion MRI pulse sequence, in which three RF excitation and refocusing pulses are used to generate echoes with equal echo times in three respective imaging volumes.

FIG. 4 shows an example similar to FIG. 3, except where three imaging volumes are excited, and in which data are acquired from each imaging volume with equal echo times (i.e., TE1=TE2=TE3). In this example, three RF excitation pulses 102a, 102b, 102c are used to excite spins in three respective imaging volumes, S1, S2, and S3. The spin magnetization is then refocused in each imaging volume by applying respective RF refocusing pulses 104a, 104b, 104c. Data are acquired using readouts 106a, 106b, 106c to facilitate the formation and sampling of echo signals 108a, 108b, 108c in each of the imaging volumes S1, S2, and S3. Like the example in FIG. 3, the RF excitation pulses 102, RF refocusing pulses 104, and readouts 106 are all applied to the respective imaging volumes S1, S2, and S3 in the same order. As a result, the first echo signal 106a is formed in the first imaging volume at a first echo time, TE1, measured relative to the first RF excitation pulse 102a; the second echo signal 106b is formed in the second imaging volume at a second echo time, TE2, measured relative to the second RF excitation pulse 102b; and the third echo signal 106c is formed in the third imaging volume at a third echo time, TE3, measured relative to the third RF excitation pulse 102c, where TE1, TE2, and TE3 are all equal.

As described above, the pulse sequences shown in FIGS. 1-4 can be adapted for use with SMS imaging techniques. In these instances, the RF excitation pulses 102 and RF refocusing pulses 104 can be replaced with time-shifted multiband RF pulses. For example, the pulse sequence shown in FIG. 1 can be modified such that the RF excitation pulses 102a, 102b are each multiband RF excitation pulses that simultaneously excite spins in multiple different slices. In this case, the first imaging volume, S1, will include a first set of slices and the second imaging volume, S2, will include a second set of slices. Similarly, the first RF refocusing pulses 104a and the second RF refocusing pulse 104b will both be multiband RF pulses that simultaneously refocus spin magnetization in the respective sets of slices.

As a non-limiting example, the RF excitation pulses 102 and RF refocusing pulses 104 can each have a multiband factor of MB=2, in which case each RF pulse will simultaneously excite/refocus spins in an imaging volume that includes a set of two slices. More generally, the RF excitation pulses 102 and RF refocusing pulses 104 can each have a multiband factor of MB=N, in which case each RF pulse will simultaneously excite/refocus spins in an imaging volume that includes a set of N slices, with N being an integer value greater than one. It will be appreciated that the different imaging volumes can include different numbers of slices by selecting the MB factor for the respective RF excitation pulses 102 and RF refocusing pulses 104. For instance, the first imaging volume, S1, can include two slices by selecting an MB factor of MB=2 for the first RF excitation pulse 102a and first RF refocusing pulse 104a, but the second imaging volume, S2, can include three slices by selecting an MB factor of MB=3 for the second RF excitation pulse 102b and the second RF refocusing pulse 104b.

When implementing an SMS imaging technique, the readouts 106 may also be adapted using different readout schemes, such as a CAIPIRINHA readout, a blipped-CAIPIRINHA readout, a Wave-CAIPI readout, and so on.

As a non-limiting example, the TDM techniques described in the present disclosure can be implemented in an EPI-based pulse sequence to accelerate relaxation-diffusion MRI acquisitions. A conventional spin-echo EPI sequence unit includes several event blocks (e.g., RF excitation, refocusing, and readout train) to acquire data from a single slice. TDM-EPI interleaves these event blocks for two or more separate imaging volumes and exploits an echo shifting technique to acquire multiple imaging volumes within a basic sequence unit. By rearranging the sequence event blocks for each imaging volume and adjusting the gradients for echo-shifting, diffusion weighted images from separate imaging volumes can be acquired at multiple distinct echo times. Besides the capability of acquiring multiple imaging volume in a single sequence unit, the TDM technique uses adaptive dephasing and rephasing pulses to improve the quality of the sampled data.

Figure 5:
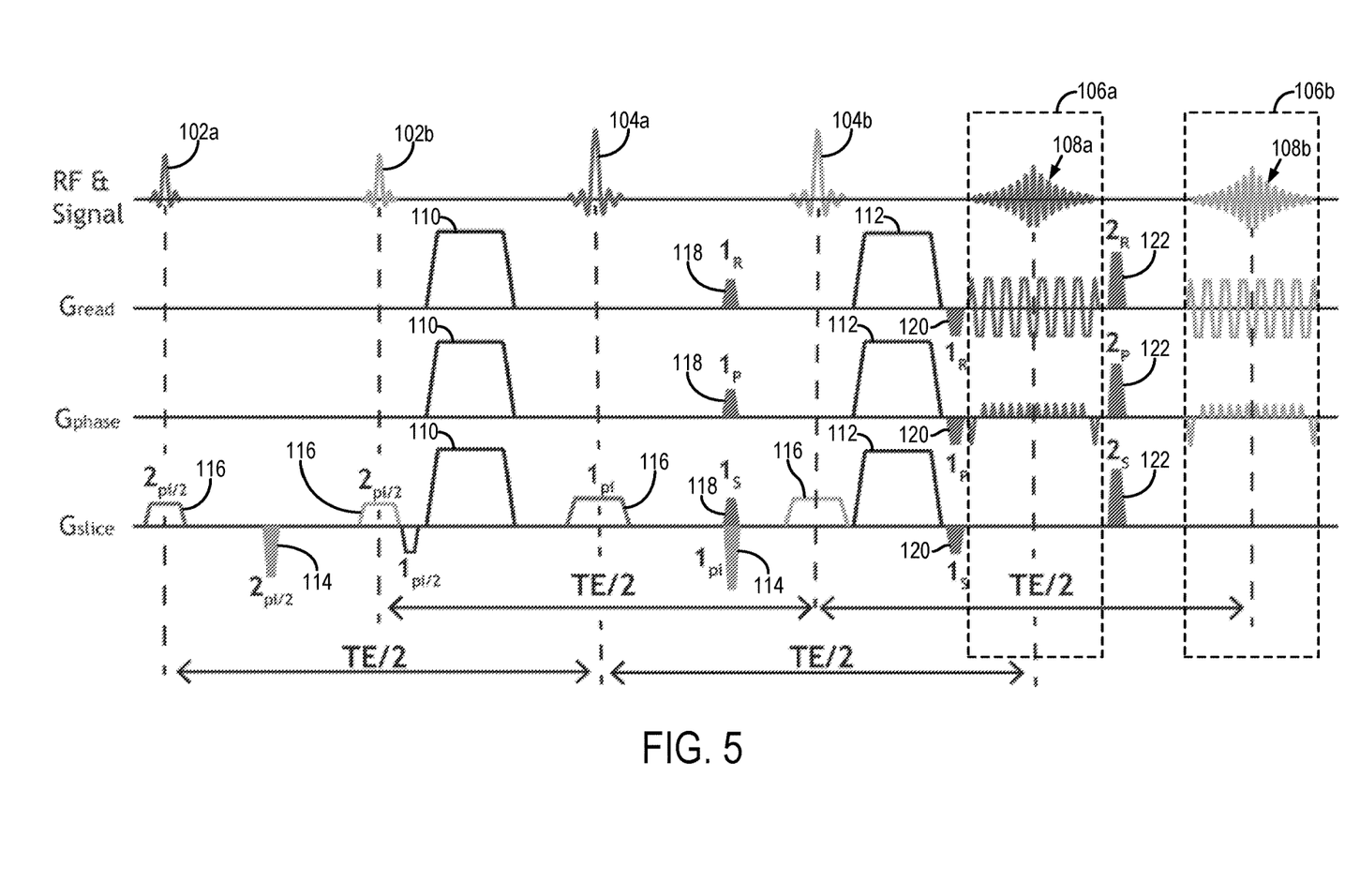
FIG. 5 is a pulse sequence diagram showing an example time-division multiplexing echo planar imaging ("EPI") pulse sequence in which two RF excitation and refocusing pulses are used to generate echoes with equal echo times in two respective imaging volumes.

FIG. 5 illustrates one example implementation of a TDM-EPI sequence, which may be referred to as TDM-2s, where a pair of 90° (excitation) RF pulses 102a, 102b and a pair of 180° (refocusing) RF pulses 104a, 104b are used, along with a pair of EPI readouts 106a, 106b. The two sets of RF pulses are used to excite two separate imaging volumes (e.g., slices S1 and S2), with the corresponding event blocks being arranged so that the TE is the same for both imaging volumes. Additional slice-rephasing gradients 114 are inserted to compensate for the phase dispersion induced by the slice-selection gradients 116. In order to separate the overlapping signals from the two slices, echo-shifting gradients 118 are added between the two 180° RF refocusing pulses 104a, 104b to shift the k-space of S1 away from that of S2.

A pair of diffusion gradients 110, 112 are applied on both sides of the two 180° RF refocusing pulses 104a, 104b, allowing the two multiplexed slices to share the same diffusion encoding. Before the EPI readout 106a of S1, rephasing gradients 120 with the same area but opposite polarity as the echo-shifting gradients 118 are added to rephase the echo signal 108a of S1 and concurrently dephase the echo signal 108b of S2. Similarly, rephasing gradients 122 with doubled area and same polarity is applied between the two EPI readout blocks 106a, 106b, which fully reverse the phase scramble of S2.

Preferably, the rewinding gradients should be enabled at the end of EPI readout train in both phase and frequency encoding directions. In general, the excited slice should keep the zeroth moment to zero before the corresponding EPI readout. Numbers listed on or below the gradients signify the relative value of gradient area (i.e., zeroth moment) and the gradients that have the same subscripts share the same relative standard unit.

Figure 6:
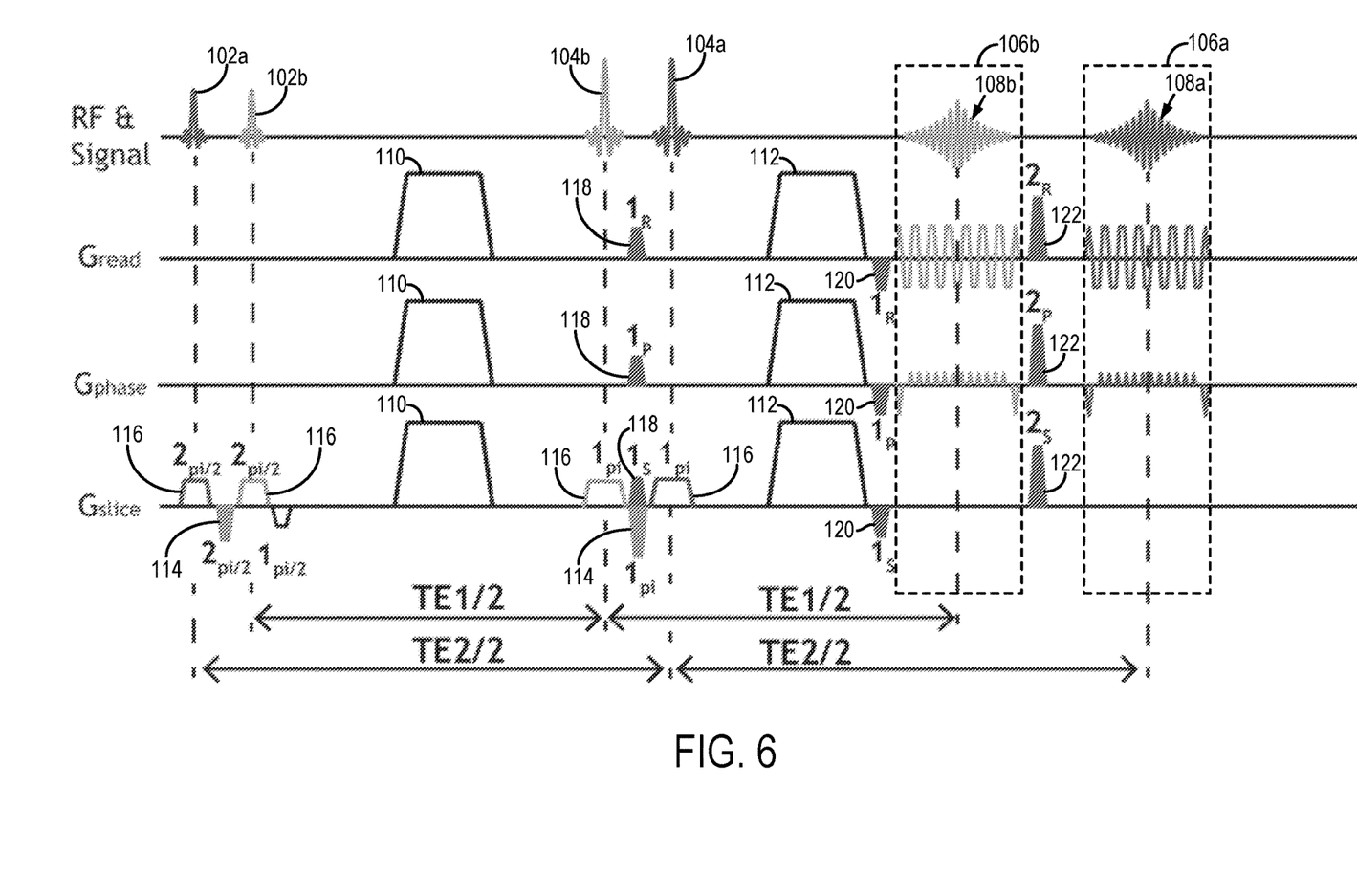
FIG. 6 is a pulse sequence diagram showing an example time-division multiplexing EPI pulse sequence in which two RF excitation and refocusing pulses are used to generate echoes with different echo times in two respective imaging volumes.
Figure 7:
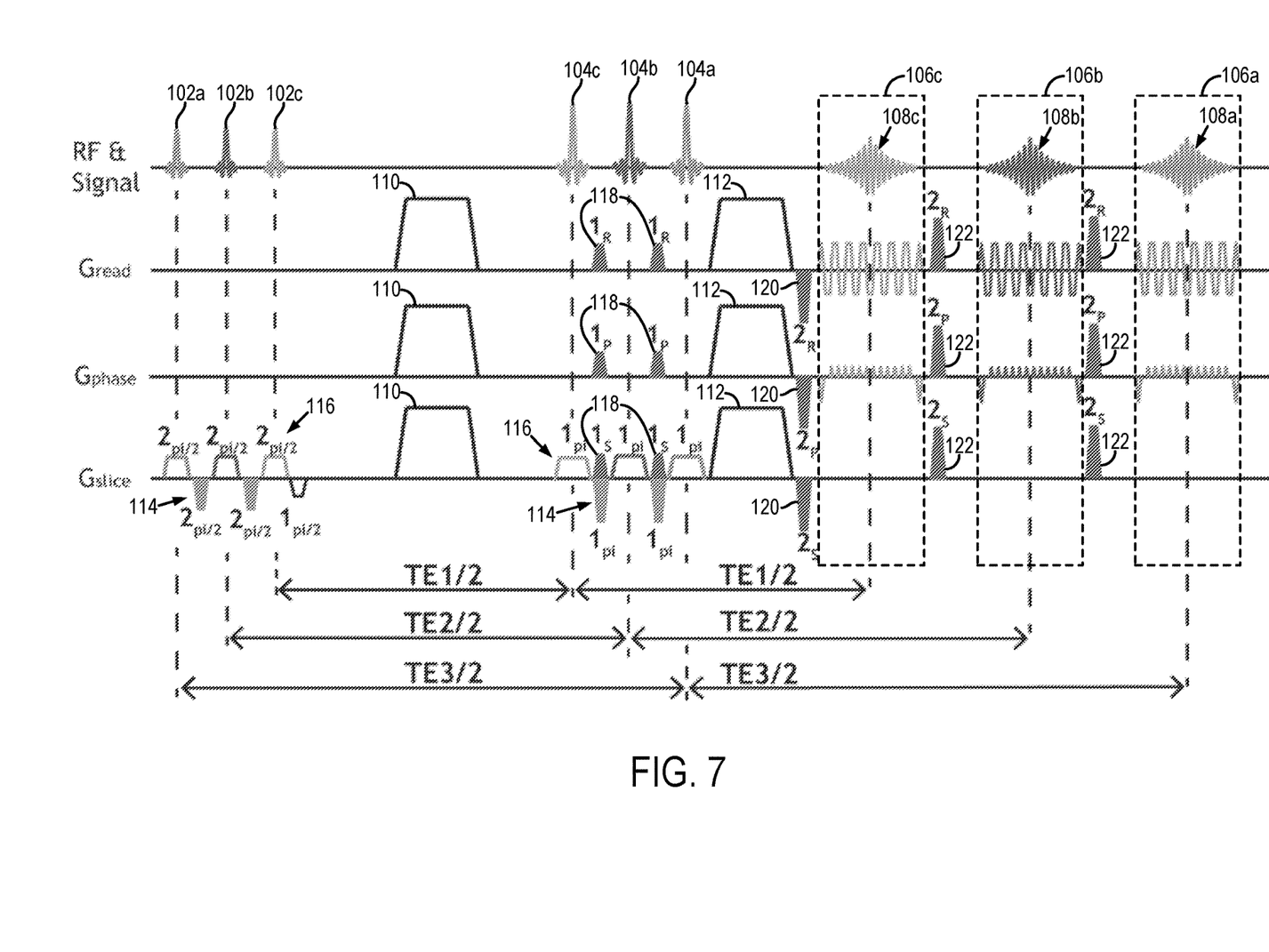
FIG. 7 is a pulse sequence diagram showing an example time-division multiplexing EPI pulse sequence in which three RF excitation and refocusing pulses are used to generate echoes with different echo times in three respective imaging volumes.

FIGS. 6 and 7 illustrate other example implementations of a TDM-EPI sequence, in which the event blocks for multiple slices are rearranged such that different imaging volumes (e.g., slices) can be acquired with different TEs. In particular, FIG. 6 illustrates a sequence that may be referred to as TDM-2e, in which two separate slices are acquired with two different TEs. The sequence in FIG. 7, which may be referred to as TDM-3e, further extends the method so that three separate slices can be acquired with three different TEs. In both sequences, the dephasing and rephasing gradients 118, 120, 122 are adjusted accordingly, such that at the time of readout, the signals from each slice are properly rephased. The area of the last rephasing gradient 122 in FIG. 6 is twice the area of the first two dephasing and rephasing gradients 118, 120 as denoted by numbers in the figure. Similarly, the area of the last three dephasing and rephasing gradients 120, 122 in FIG. 7 is twice the area of the first two dephasing and rephasing gradients 118. The areas and directions of dephasing and rephasing gradients impact image quality, which is further explained below.

The examples described above with respect to FIGS. 5-7 can be configured to implement adaptive dephasing and rephasing gradients for echo shifting. When considered in the k-space domain, the direction and the area of the echo-shifting gradients determine the shifting direction and distance between the respective sampled k-space data of the multiplexed slices. In principle, the echo-shifting gradient(s) can be concurrently applied in all three directions (e.g., in phase-encoding, frequency-encoding and slice-selection directions). For simplicity, in a non-limiting example echo-shifting gradients can be described in phase-encoding and frequency-encoding directions and denoted it as $G_{dep}(t)=G_x(t)e_x+G_y(t)e_y$, where $G_x(t)$ and $G_y(t)$ are the gradient strength along the two directions, respectively. The post gradient signal from a voxel is given by:

$$S_{voxel} = \int_{voxel} \rho(\vec{r})e^{-i\gamma \vec{G}_{dep}(t)\cdot\vec{r}}d\vec{r} = \int_{x_0-\Delta x/2}^{x_0+\Delta x/2}\int_{y_0-\Delta y/2}^{y_0+\Delta y/2} \rho(\vec{r})e^{-i\gamma(S_x\cdot x+S_y\cdot y)}dxdy;$$

where $\Delta x$ and $\Delta y$ are the voxel dimensions along both directions, and $S_x$ and $S_y$ are the dephasing gradient areas of $G_x(t)$ and $G_y(t)$, respectively. It can be further simplified as $S_{voxel}=\rho|\text{sinc}(\Delta\theta_x/2)\cdot\text{sinc}(\Delta\theta_y/2)|$ when the proton density $\rho(r)$ is uniform, and where $\Delta\theta_x$ and $\Delta\theta_y$ are the phase dispersions along corresponding directions within a voxel. The larger the area of dephasing gradient, the further away the shift is from the center of k-space and hence the smaller the amplitude of the echo signal.

In order to prevent signal leakage across slices, the area of dephasing gradient should be large enough to attenuate the echo signal leaked from other slices to noise level. In some instances, the amplitude of the echo-shifting gradient(s) can be specified as $G_x(t)=G(t)\cos\theta$, $G_y(t)=G(t)\sin\theta$ in the sequence implementation in order to keep the amplitude of $G_{dep}(t)$ as $G(t)$, and where $\theta$ is modulation angle for amplitude. Note that the amplitude and direction refer to those of the first echo-shifting gradient(s) between the 180° RF refocusing pulses. Moreover, a shift factor can be introduced as, $$k_{shift}=2\gamma\sqrt{S_x^2+S_y^2}=2\gamma\sqrt{(\int G_x(t)dt)^2+(\int G_y(t)dt)^2}=2\gamma\int G(t)dt;$$

to represent the relative k-space shift cause by the echo-shifting gradients. The echo-shifting gradients can in some instances be accompanied with the undesired single diffusion encoding effect induced by itself and the double diffusion encoding effect when coupling with the diffusion encoding gradients. To that end, the corresponding apparent b-value is given by, $$b=b_1+b_2+C\cdot G_1\cdot G_2\cdot\cos(\phi);$$

where $b_1$, $b_2$, and $G_1$, $G_2$ are the b-values due to the amplitudes of the diffusion encoding and echo-shifting gradients respectively, $\phi$ is the relative angle between the two, and C is a constant term related to the mixing time, diffusion time and the imaging order of TDM slices.

In order to minimize the single diffusion encoding effect induced by the echo-shifting gradient itself, the amplitude can be selected to be as small as possible while still being able to prevent signal leakage across slices. The value of $b_2$ is proportional to $G_2^2$ and is usually negligible for an optimal $G_2$ (e.g., $b_2 \leq 7$ s/mm$^2$), compared to the maximum value of $b_1$ ($\geq 1000$ s/mm$^2$). Nevertheless, the cross term may add nonnegligible double diffusion effect when $G_1$ is large and the two gradients are along the same direction. Accordingly, the direction and amplitude as well as the duration of the echo-shifting gradient can be adaptively optimized to reduce the additional diffusion effect caused by the echo-shift gradients. For example, $G_1$ and $G_2$ can be orthogonal making the cross term $C\cdot G_1\cdot G_2\cdot\cos\varphi$ equal to zero.

Figure 8:
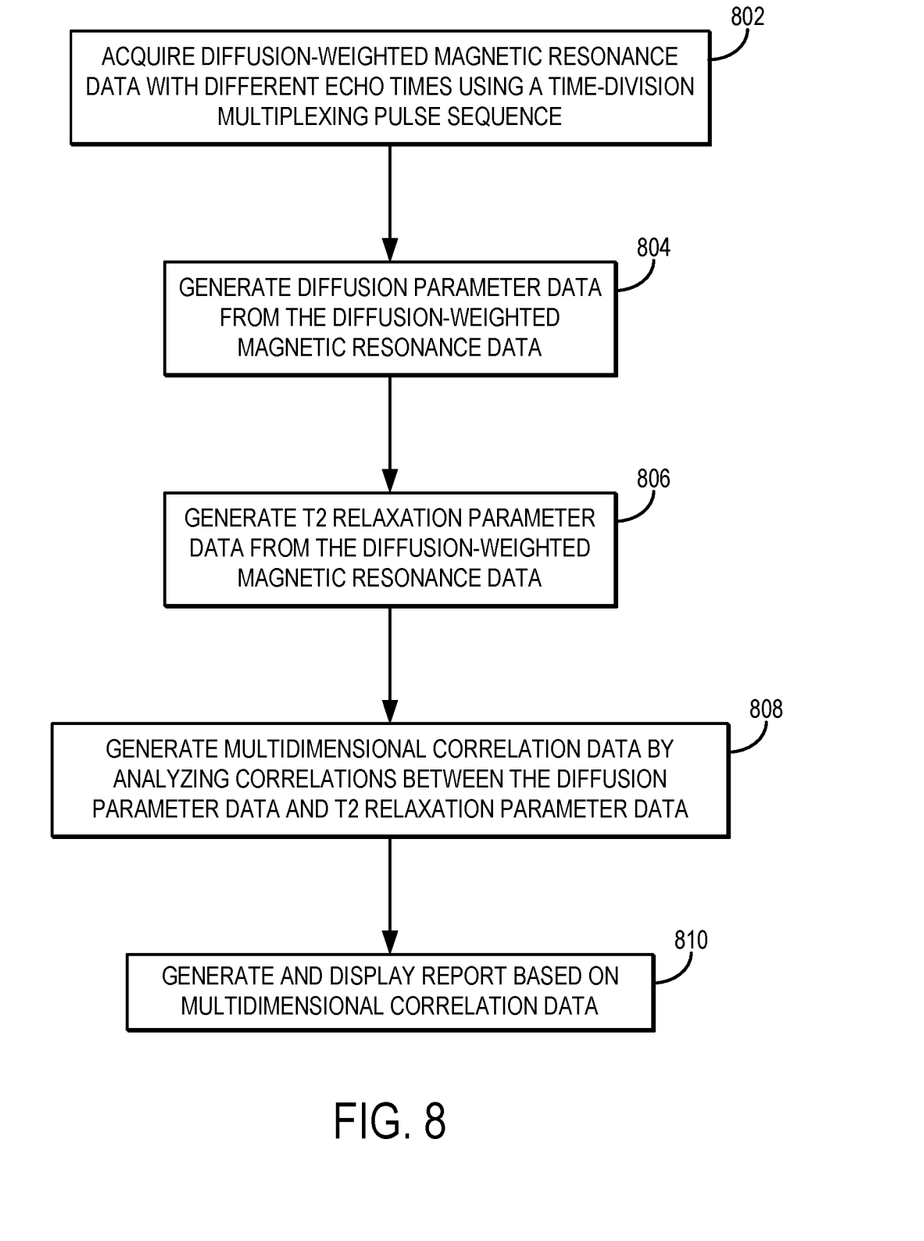
FIG. 8 is a flowchart setting forth the steps of an example method for multidimensional analysis of diffusion-relaxation using the pulse sequences described in the present disclosure.

Referring now to FIG. 8, a flowchart is now illustrated as setting forth the steps of an example method for using the time-division multiplexing pulse sequences described in the present disclosure to acquire diffusion-weighted data from a subject with different echo times, such that multidimensional diffusion-relaxation analysis can be performed to investigate tissue abnormalities. It will be appreciated, however, that the time-division multiplexing pulse sequences can also be used in other imaging applications other than diffusion-weighted imaging.

The method includes acquiring diffusion-weighted magnetic resonance data from a subject with multiple different echo times using a time-division multiplexing diffusion imaging pulse sequence, as indicated at step 802. Examples of such pulse sequences are described above. In general, the diffusion-weighted data will include multiple different imaging volumes (e.g., different slices, slabs, sets of slices) acquired with different echo times.

From the diffusion-weighted magnetic resonance data, diffusion parameter data are computed, as indicated at step 804. The diffusion parameter data can include diffusion parameter values and/or diffusion parameter maps that depict the spatial distribution of diffusion parameter values within the imaging volumes. For example, the diffusion parameter data can include diffusion parameter maps, such as apparent diffusion coefficient ("ADC") maps, mean diffusivity ("MD") maps, fraction anisotropy ("FA") maps, mean kurtosis ("MK") maps, or other diffusion-weighted imaging, diffusion kurtosis imaging ("DKI"), diffusion tensor imaging ("DTI"), or other such diffusion imaging-based parameter maps.

Because the diffusion-weighted magnetic resonance data are acquired with multiple different echo times, T2 relaxation parameter data can also be computed from the diffusion-weighted magnetic resonance data, as indicated at step 806. The T2 relaxation parameter data can include T2 relaxation parameter values and/or T2 relaxation parameter maps. For example, the T2 relaxation parameter data can include T2 relaxation rate maps that depict the spatial distribution of quantitative T2 relaxation rate values within the imaging volumes.

Using the diffusion parameter data and the T2 relaxation data, multidimensional correlation data can be generated, as indicated at step 808, based on analyzing the multidimensional correlation between the diffusion parameters and T2 relaxation rate. The correlations are multidimensional because of the multidimensional space of statistical variables over which the correlations are analyzed.

As an example, for a water molecule diffusing in a medium with transverse relaxation rate r=1/T2, and the diffusivity along a direction u of D(u), the decay of the diffusion magnetic resonance signal due to relaxation and diffusion can be modeled using the exponential functions exp(−rt) and exp(−bD(u)), where t and b denote the TE and b-value, respectively. Therefore, the diffusion magnetic resonance signal from water molecules with different relaxation and diffusion can be modeled jointly by, $$S(t,b,u)=S_0\int e^{-rt-bD(u)}\rho(r,D)dr\,dD \quad (1);$$

where ρ(r, D) represents the joint probability distribution of r and D. Because relaxation and diffusion reflect different properties of the underlying tissue, the statistical properties of ρ(r, D) can be used to characterize different aspects of tissue microstructure. It will be appreciated to those skilled in the art that Eqn. (1) is just one example model, and others could also be implemented.

Eqn. (1) implies that, as one non-limiting example, the joint PDF ρ(r, D) can be estimated via the inverse Laplace transform of the normalized signal s(t, b)/s_0.

A report can then be generated based on the multidimensional correlation data, as indicated at step 810. The report can include images, parameter maps, plots, quantitative values, textural information, other data, or combinations thereof. For instance, the report can include a visual depiction of the multidimensional correlation data, which may be displayed to a user together with the related diffusion parameter data and/or T2 relaxation parameter data. As an example, the report can display correlation coefficient maps between relaxation rate and diffusivity (or other diffusion parameters) for one or more joint PDFs. Based on this multidimensional correlation analysis and the resulting report, a user can investigate tissue abnormalities that cannot be analyzed using conventional diffusion imaging techniques.

Figure 9:
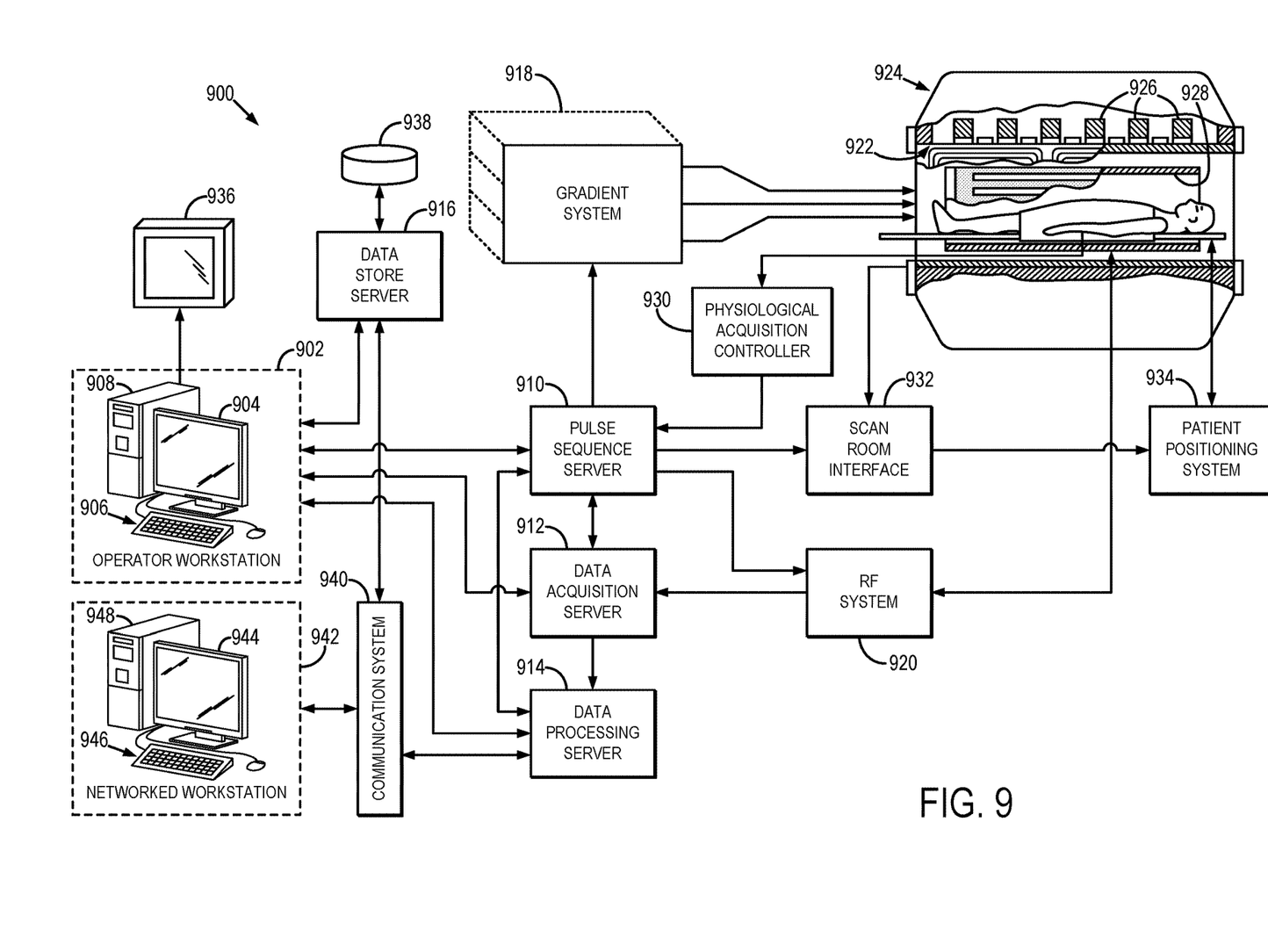
FIG. 9 is a block diagram of an example MRI system that can implement the methods described in the present disclosure.

Referring particularly now to FIG. 9, an example of a magnetic resonance imaging ("MRI") system 900 that can implement the methods described here is illustrated. The MRI system 900 includes an operator workstation 902 that may include a display 904, one or more input devices 906 (e.g., a keyboard, a mouse), and a processor 908. The processor 908 may include a commercially available programmable machine running a commercially available operating system. The operator workstation 902 provides an operator interface that facilitates entering scan parameters into the MRI system 900. The operator workstation 902 may be coupled to different servers, including, for example, a pulse sequence server 910, a data acquisition server 912, a data processing server 914, and a data store server 916. The operator workstation 902 and the servers 910, 912, 914, and 916 may be connected via a communication system 940, which may include wired or wireless network connections.

The pulse sequence server 910 functions in response to instructions provided by the operator workstation 902 to operate a gradient system 918 and a radiofrequency ("RF") system 920. Gradient waveforms for performing a prescribed scan are produced and applied to the gradient system 918, which then excites gradient coils in an assembly 922 to produce the magnetic field gradients $G_x$, $G_y$, and $G_z$ that are used for spatially encoding magnetic resonance signals. The gradient coil assembly 922 forms part of a magnet assembly 924 that includes a polarizing magnet 926 and a whole-body RF coil 928.

RF waveforms are applied by the RF system 920 to the RF coil 928, or a separate local coil to perform the prescribed magnetic resonance pulse sequence. Responsive magnetic resonance signals detected by the RF coil 928, or a separate local coil, are received by the RF system 920. The responsive magnetic resonance signals may be amplified, demodulated, filtered, and digitized under direction of commands produced by the pulse sequence server 910. The RF system 920 includes an RF transmitter for producing a wide variety of RF pulses used in MRI pulse sequences. The RF transmitter is responsive to the prescribed scan and direction from the pulse sequence server 910 to produce RF pulses of the desired frequency, phase, and pulse amplitude waveform. The generated RF pulses may be applied to the whole-body RF coil 928 or to one or more local coils or coil arrays.

The RF system 920 also includes one or more RF receiver channels. An RF receiver channel includes an RF preamplifier that amplifies the magnetic resonance signal received by the coil 928 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (2);$$

and the phase of the received magnetic resonance signal may also be determined according to the following relationship:

$$\varphi = \tan^{-1}\left(\frac{Q}{I}\right). \quad (3)$$

The pulse sequence server 910 may receive patient data from a physiological acquisition controller 930. By way of example, the physiological acquisition controller 930 may receive signals from a number of different sensors connected to the patient, including electrocardiograph ("ECG") signals from electrodes, or respiratory signals from a respiratory bellows or other respiratory monitoring devices. These signals may be used by the pulse sequence server 910 to synchronize, or "gate," the performance of the scan with the subject's heart beat or respiration.

The pulse sequence server 910 may also connect to a scan room interface circuit 932 that receives signals from various sensors associated with the condition of the patient and the magnet system. Through the scan room interface circuit 932, a patient positioning system 934 can receive commands to move the patient to desired positions during the scan.

The digitized magnetic resonance signal samples produced by the RF system 920 are received by the data acquisition server 912. The data acquisition server 912 operates in response to instructions downloaded from the operator workstation 902 to receive the real-time magnetic resonance data and provide buffer storage, so that data is not lost by data overrun. In some scans, the data acquisition server 912 passes the acquired magnetic resonance data to the data processor server 914. In scans that require information derived from acquired magnetic resonance data to control the further performance of the scan, the data acquisition server 912 may be programmed to produce such information and convey it to the pulse sequence server 910. For example, during pre-scans, magnetic resonance data may be acquired and used to calibrate the pulse sequence performed by the pulse sequence server 910. As another example, navigator signals may be acquired and used to adjust the operating parameters of the RF system 920 or the gradient system 918, or to control the view order in which k-space is sampled. In still another example, the data acquisition server 912 may also process magnetic resonance signals used to detect the arrival of a contrast agent in a magnetic resonance angiography ("MRA") scan. For example, the data acquisition server 912 may acquire magnetic resonance data and processes it in real-time to produce information that is used to control the scan.

The data processing server 914 receives magnetic resonance data from the data acquisition server 912 and processes the magnetic resonance data in accordance with instructions provided by the operator workstation 902. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 914 are conveyed back to the operator workstation 902 for storage. Real-time images may be stored in a data base memory cache, from which they may be output to operator display 902 or a display 936. Batch mode images or selected real time images may be stored in a host database on disc storage 938. When such images have been reconstructed and transferred to storage, the data processing server 914 may notify the data store server 916 on the operator workstation 902. The operator workstation 902 may be used by an operator to archive the images, produce films, or send the images via a network to other facilities.

The MRI system 900 may also include one or more networked workstations 942. For example, a networked workstation 942 may include a display 944, one or more input devices 946 (e.g., a keyboard, a mouse), and a processor 948. The networked workstation 942 may be located within the same facility as the operator workstation 902, or in a different facility, such as a different healthcare institution or clinic.

The networked workstation 942 may gain remote access to the data processing server 914 or data store server 916 via the communication system 940. Accordingly, multiple networked workstations 942 may have access to the data processing server 914 and the data store server 916. In this manner, magnetic resonance data, reconstructed images, or other data may be exchanged between the data processing server 914 or the data store server 916 and the networked workstations 942, such that the data or images may be remotely processed by a networked workstation 942.

The present disclosure has described one or more preferred embodiments, and it should be appreciated that many equivalents, alternatives, variations, and modifications, aside from those expressly stated, are possible and within the scope of the invention.

The invention claimed is:

1. A method for magnetic resonance imaging, the method comprising:
   (a) controlling a magnetic resonance imaging (MRI) system to perform a pulse sequence that includes:
      at least a first radio frequency (RF) excitation pulse that excites spins in a first imaging volume and a second RF excitation pulse that excites spins in a second imaging volume, wherein the second RF excitation pulse is time-shifted relative to the first RF excitation pulse by a time duration;
      at least a first RF refocusing pulse that refocuses spins in the first imaging volume at a first echo time relative to the first RF excitation pulse and a second RF refocusing pulse that refocuses spins in the second imaging volume at a second echo time relative to the second RF excitation pulse, wherein the second RF refocusing pulse is time-shifted relative to the first RF refocusing pulse by the time duration;
      a first readout during which first magnetic resonance data are acquired from the first imaging volume;
      a second readout during which second magnetic resonance data are acquired from the second imaging volume;
   (b) reconstructing magnetic resonance images from the first magnetic resonance data and the second magnetic resonance data, wherein the magnetic resonance images depict the first imaging volume and the second imaging volume; and
   (c) displaying the reconstructed magnetic resonance images to a user.

2. The method of claim 1, wherein the first RF excitation pulse is applied before the second RF excitation pulse and the second RF refocusing pulse is applied before the first RF refocusing pulse, such that the first echo time is different than the second echo time.

3. The method of claim 1, wherein the first RF excitation pulse is applied before the second RF excitation pulse and the first RF refocusing pulse is applied before the second RF refocusing pulse, such that the first echo time and the second echo time are equal.

4. The method of claim 1, wherein the pulse sequence further comprises:

at least a third RF excitation pulse that excites spins in a third imaging volume;

at least a third RF refocusing pulse that that refocuses spins in the third imaging volume at a third echo time relative to the third RF excitation pulse; and a third readout during which third magnetic resonance data are acquired from the third imaging volume.

5. The method of claim 4, wherein the first, second, and third RF excitation pulses are applied in a different temporal order than the first, second, and third RF refocusing pulses such that the first, second, and third echo times are different from each other.

6. The method of claim 1, wherein the first RF excitation pulse is a single band RF excitation pulse and the first imaging volume comprises a first slice.

7. The method of claim 6, wherein the second RF excitation pulse is a single band RF excitation pulse and the second imaging volume comprises a second slice.

8. The method of claim 1, wherein the first RF excitation pulse is a multiband RF excitation pulse and the first imaging volume comprises a first plurality of simultaneously excited slices.

9. The method of claim 8, wherein the second RF excitation pulse is a multiband RF excitation pulse and the second imaging volume comprises a second plurality of simultaneously excited slices.

10. The method of claim 1, wherein the first readout and the second readout comprise echo planar imaging (EPI) readouts.

11. The method of claim 1, wherein the first imaging volume comprises a first slice and the second imaging volume comprises a second slice.

12. The method of claim 1, wherein the first RF refocusing pulse causes spins in the first imaging volume to refocus into a first echo signal and the second RF refocusing pulse causes spins in the second imaging volume to refocus into a second echo signal that is non-overlapping in time with the first echo signal.

13. The method of claim 1, wherein the first readout is configured to generate multiple spin echoes at different first echo times within the first imaging volume, and the second readout is configured to generate multiple spin echoes at different second echo times within the second imaging volume.

14. The method of claim 1, wherein the pulse sequence further comprises an inversion recovery (IR) RF pulse applied before the first and second RF excitation pulses.

15. The method of claim 1, wherein the pulse sequence further comprises at least one diffusion-encoding gradient that applies diffusion encoding to spins in each of the first and second imaging volumes, such that the first and second magnetic resonance data are first and second diffusion-weighted magnetic resonance data.

16. The method of claim 15, further comprising generating T2 relaxation maps from the first and second diffusion-weighted magnetic resonance data and generating diffusion parameter maps from the magnetic resonance images.

17. The method of claim 16, further comprising generating multidimensional correlation data by computing correlations between the T2 relaxation maps and the diffusion parameter maps.

18. The method of claim 17, wherein the correlations are computed based in part on a joint probability distribution of T2 relaxation parameters and diffusion parameters.

19. The method of claim 1, wherein the pulse sequence further comprises echo-shifting gradients that alternately dephase and rephase echoes in order to separate sampled k-space data for each of the first and second imaging volumes.

20. The method of claim 19, wherein at least one of a magnitude, direction, and duration of the echo-shifting gradients are adaptively optimized to reduce additional diffusion encoding caused by the echo-shifting gradients.

* * * * *